United States Patent
Kim

(10) Patent No.: US 9,653,524 B2
(45) Date of Patent: May 16, 2017

(54) ORGANIC LIGHT EMITTING DISPLAY APPARATUS

(71) Applicant: Samsung Display Co., Ltd., Yongin, Gyeonggi-Do (KR)

(72) Inventor: Gee-Bum Kim, Yongin (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 10 days.

(21) Appl. No.: 14/307,837

(22) Filed: Jun. 18, 2014

(65) Prior Publication Data
US 2015/0200234 A1 Jul. 16, 2015

(30) Foreign Application Priority Data
Jan. 13, 2014 (KR) ........................ 10-2014-0004056

(51) Int. Cl.
*H01L 29/08* (2006.01)
*H01L 27/32* (2006.01)
*H01L 51/52* (2006.01)

(52) U.S. Cl.
CPC ...... *H01L 27/3246* (2013.01); *H01L 51/5271* (2013.01); *H01L 51/5284* (2013.01)

(58) Field of Classification Search
CPC .................. H01L 27/3216; H01L 27/3246
USPC ......................................................... 257/40
See application file for complete search history.

(56) References Cited

U.S. PATENT DOCUMENTS

| 5,969,702 A | * | 10/1999 | Bae ................................ 345/92 |
| 2007/0075627 A1 | * | 4/2007 | Kimura ................... H01L 27/15 313/503 |
| 2012/0056531 A1 | | 3/2012 | Park et al. |
| 2012/0223346 A1 | * | 9/2012 | Ohsawa et al. ................. 257/89 |
| 2013/0270527 A1 | * | 10/2013 | Kwon ................. H01L 33/0041 257/40 |
| 2014/0061605 A1 | | 3/2014 | Kim et al. |

FOREIGN PATENT DOCUMENTS

| KR | 1020060100902 A | 9/2006 |
| KR | 1020080026377 A | 3/2008 |
| KR | 1020120100813 A | 9/2012 |
| KR | 1020130030148 A | 3/2013 |
| KR | 1020130045299 A | 5/2013 |
| KR | 1020140030842 A | 3/2014 |

* cited by examiner

*Primary Examiner* — Marc Armand
*Assistant Examiner* — Sarah Salerno
(74) *Attorney, Agent, or Firm* — Cantor Colburn LLP

(57) ABSTRACT

An organic light emitting display apparatus includes: a first pixel electrode and a second pixel electrode on a substrate and spaced apart from each other, each of the first pixel electrode and the second pixel electrode including a reflective layer; a pixel definition layer extending between and overlapping adjacent edges of the first pixel electrode and the second pixel electrode; a first intermediate layer and a second intermediate layer respectively on the first pixel electrode and the second pixel electrode; and an opposite electrode on the first intermediate layer, the second intermediate layer and the pixel definition layer and including a reflective layer.

15 Claims, 3 Drawing Sheets

ORGANIC LIGHT EMITTING DISPLAY APPARATUS

This application claims priority to Korean Patent Application No. 10-2014-0004056, filed on Jan. 13, 2014, and all the benefits accruing therefrom under 35 U.S.C. §119, the disclosure of which is incorporated herein in its entirety by reference.

BACKGROUND

1. Field

One or more embodiment of the invention relates to an organic light emitting display apparatus.

2. Description of the Related Art

An organic light emitting display apparatus is a self-luminous display device including an organic light emitting device having a hole injection electrode, an electron injection electrode, and an organic light emitting layer disposed therebetween. In the self-luminous display device, excitons, which occur when holes injected from the hole injection, and electrons injected from the electron injection electrode, are recombined in the organic light emitting layer, decay from an exited state to a ground state, thereby emitting light.

Since the organic light emitting display apparatus requires no additional light source, it may be driven at a relatively low-voltage and may be relatively lightweight and thin. Also since the viewing angle, contrast and response speed of the organic light emitting display apparatus are excellent, the application scope thereof has expanded from personal portable devices such as MP3 players or mobile phones, to televisions.

SUMMARY

One or more embodiment of the invention includes an organic light emitting display apparatus.

Additional features will be set forth in part in the description which follows and, in part, will be apparent from the description, or may be learned by practice of the embodiments.

According to one or more embodiment of the invention, an organic light emitting display apparatus includes: a first pixel electrode and a second pixel electrode on a substrate and spaced apart from each other, and each including a reflective layer; a pixel definition layer extending between and overlapping adjacent edges of the first pixel electrode and the second pixel electrode; a first intermediate layer and a second intermediate layer respectively on the first pixel electrode and the second pixel electrode; and an opposite electrode on the first intermediate layer, the second intermediate layer and the pixel definition layer, and including a reflective layer.

The pixel definition layer may include: a flat part in an area where the first pixel electrode and the second pixel electrode do no overlap; a first inclined part extending from the flat part to the edge of the first pixel electrode; and a second inclined part extending from the flat part to the edge of the second pixel electrode.

The first inclined part and the second inclined part may have a first inclination angle turning point and a second inclination angle turning point, respectively, where a rate of change in an inclination angle thereof is not continuous.

The pixel definition layer may include a first layer area and a second layer area respectively on a bottom and a top with respect to a virtual line connecting the first inclination angle turning point and the second inclination angle turning point to each other.

The apparatus may further include a first black matrix and a second black matrix respectively between the substrate and the first pixel electrode and between the substrate and the second pixel electrode.

Widths of the first black matrix and the second black matrix may be equal to or greater than widths of the first pixel electrode and the second pixel electrode, respectively, in a plan view.

A width of an area of the first pixel electrode and the second pixel electrode, respectively, overlapped by the pixel definition layer at the edge of the first pixel electrode and the second pixel electrode, is equal to or greater than about 3 micrometers (μm).

The apparatus may further include a first thin film transistor and a second thin film transistor on the substrate and electrically connected to the first pixel electrode and the second pixel electrode, respectively. The first thin film transistor and the second thin film transistor may be respectively overlap the first pixel electrode and the second pixel electrode, in a plan view.

A reflectivity of each of the first pixel electrode, the second pixel electrode and the opposite electrode may be equal to or greater than about 90%.

The first intermediate layer may emit one of red light, green light and blue light and the second intermediate layer may emit light of a different color from that emitted by the first intermediate layer.

According to one or more embodiment of the invention, an organic light emitting display apparatus includes: a first light emitting area including a first pixel electrode which includes a reflective layer, and a first intermediate layer which is on the first pixel electrode and is configured to emit light; a second light emitting area including a second pixel electrode which is spaced apart from the first pixel electrode and includes a reflective layer, and a second intermediate layer which is on the second pixel electrode and is configured to emit light; and a first light extraction region between the first light emitting area and the second light emitting area. A light is emitted from the first intermediate layer and the second intermediate layer to outside the organic light emitting display apparatus, via the first light extraction region.

The apparatus may further include: a pixel definition layer on the first light extraction region and overlapping edges of the first pixel electrode and the second pixel electrode; and an opposite electrode on the first intermediate layer, the second intermediate layer and the pixel definition layer and including a reflective layer.

The apparatus may further include a third light emitting area including a third pixel electrode spaced apart from the first pixel electrode and the second pixel electrode and including a reflective layer, and a third intermediate layer on the third pixel electrode and configured to emit light. A total area of the first light emitting area is greater than a sum of areas of the second light emitting area and the third light emitting area, and the first light extraction region is between the first light emitting area and the third light emitting area.

The first intermediate layer, the second intermediate layer and the third intermediate layer may emit blue light, green light and red light, respectively, and the first light extraction region may emit the blue light, the green light and the red light emitted from the first through third intermediate layers, to outside the organic light emitting display apparatus.

The apparatus may further include: a third light emitting area including a third pixel electrode spaced apart from the second pixel electrode and including a reflective layer, and a third intermediate layer on the third pixel electrode and configured to emit light; and a second light extraction region between the second light emitting area and the third light emitting area. A light is emitted from the second intermediate layer and the third intermediate layer to outside organic light emitting display apparatus, via the second light extraction region.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
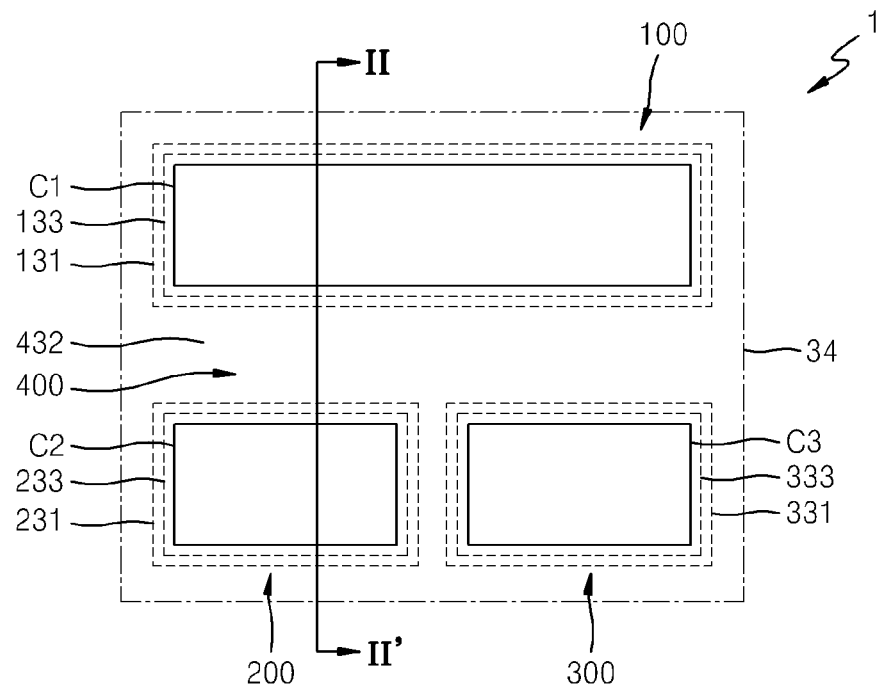
FIG. 1 is a top plan view illustrating an embodiment of an organic light emitting display apparatus according to the invention.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the figures, to explain features of the invention. As used herein, the term "and/or" includes any and all combinations of one or more of the associated listed items. Expressions such as "at least one of," when preceding a list of elements, modify the entire list of elements and do not modify the individual elements of the list.

The invention may have various modifications and be embodied via diverse embodiments. Therefore, specific embodiments are shown in the drawings and described in more detail. The effects and features of the invention and methods of achieving them will be clarified through following embodiments described with reference to the accompanying drawings. However, the invention is not limited to the embodiments below and implemented in various forms.

Hereinafter, the embodiments of the invention are described in more detail with reference to the accompanying drawings and while described referring to the drawings, like reference numerals refer to like elements and their overlapping descriptions are omitted.

In the embodiments below, the terms 'first' and 'second' are not construed as being limited to restrictive meanings and used for distinguishing one component from another component.

The terms in the singular form may include the plural form unless they have a clearly different meaning in the context.

In the embodiments below, the term "include" or "comprise" means that a feature or a component listed in the specification exits and does not exclude at least one another feature or component.

In this specification, when a portion of a layer, a film, a region, and a plate is referred to as being "on" another portion, it can be directly on the other portion, or intervening portions may also be present.

Spatially relative terms, such as "below," "above," and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be described in detail with reference to the accompanying drawings.

In the drawings, for convenience of description, the sizes of components may be exaggerated or reduced. In addition, the size and thickness of each element shown in the drawings are arbitrary, and thus the invention is not limited thereto.

Figure 2:
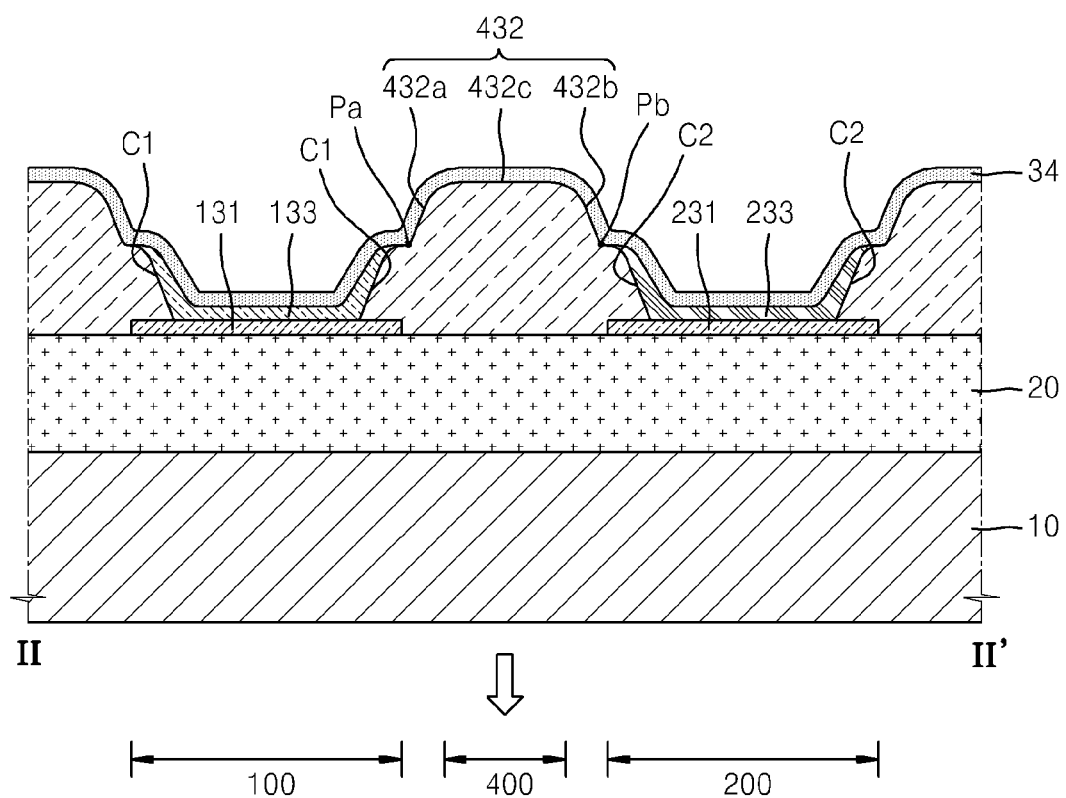
FIG. 2 is a cross-sectional view taken along line II-II of FIG. 1.

FIG. 1 is a top plan view illustrating an embodiment of an organic light emitting display apparatus. FIG. 2 is a cross-sectional view taken along line II-II' of FIG. 1.

Referring to FIGS. 1 and 2, the organic light emitting display apparatus 1 includes a first light emitting area 100, a second light emitting area 200, a third light emitting area 300 and a first light extraction region 400 defined therein.

A first pixel electrode 131 including a reflective layer, and a first intermediate layer 133, are disposed on a substrate 10 and in the first light emitting area 100. A second pixel electrode 231 including a reflective layer, and a second intermediate layer 233, are disposed on the substrate 10 and in the second light emitting area 200. A third pixel electrode 331 including a reflective layer, and a third intermediate layer 333, may be disposed on the substrate 10 and in the third light emitting area 300.

A pixel definition layer 432 may be disposed between the first pixel electrode 131 and the second pixel electrode 231, which are spaced apart from each other, in the top plan view. An opening C1 exposing a portion of the first pixel electrode 131 and an opening C2 exposing a portion of the second pixel electrode 231 may be defined in the pixel definition layer 432.

The pixel definition layer 432 may be disposed between the second pixel electrode 231 and the third pixel electrode 331 and between the first pixel electrode 131 and the third pixel electrode 331. An opening C3 exposing a portion of the third pixel electrode 331 may be further defined in the pixel definition layer 432.

An opposite electrode 34 including a reflective layer may be disposed on the first intermediate layer 133, the second intermediate layer 233 and the pixel definition layer 432. That is, the opposite electrode 34 may be commonly disposed on an entire pixel of the organic light emitting display apparatus 1 among a plurality of pixels thereof.

An insulating layer 20 may be disposed between the substrate 10 and the first pixel electrode 131, and between the substrate 10 and the second pixel electrode 231.

The first light extraction region 400 is disposed between the first light emitting area 100 and the second light emitting area 200 in the top plan view, and the light emitted from the first intermediate layer 133 and the second intermediate layer 233 may be emitted to the outside of the organic light emitting display apparatus 1 via the first light extraction region 400.

The embodiment of the first light emitting area 100 included in the organic light emitting display apparatus 1 of FIG. 1 has a broader area than the second light emitting area 200 and the third light emitting area 300. A total area of the first light emitting area 100 may be greater than individual areas of the first and second light emitting layers 200 and 300, and a total area of the first and second light emitting areas 200 and 300 taken together. The first intermediate layer 133 included in the first light emitting area 100 may emit blue light. That is, by designing the first light emitting area 100, wherefrom blue light is emitted with a relatively low optical efficiency, to be broader than other areas, white balance may be adjusted. The first light emitting area 100 may disposed at a same side of both the second and third light emitting areas 200 and 300.

The total area of the first light emitting area 100 may be about twice the individual area of the second light emitting area 200 and the third light emitting area 300. The first light extraction region 400 may extend and be disposed between the first light emitting area 100, and the second and third light emitting areas 200 and 300.

That is, the light emitted from the first intermediate layer 133, the second intermediate layer 233 and the third intermediate layer 333 may be emitted to the outside of the organic light emitting display apparatus 1 through the first light extraction region 400.

The pixel definition layer 432, and the opposite electrode 34 disposed on the pixel definition layer 432, may be disposed in the first light extraction region 400.

The first pixel electrode 131, the second pixel electrode 231 and/or the third pixel electrode 331 may include a reflective layer. In an embodiment, for example, the reflective layer includes at least one of Ag, Mg, Al, Pt, Pd, Au, Ni, Nd, Ir and Cr. A transparent or semi-transparent electrode layer including at least one of indium tin oxide ("ITO"), indium zinc oxide ("IZO"), zinc oxide ("ZnO"), indium oxide ("In2O3"), indium gallium oxide ("IGO") and aluminum zinc oxide ("AZO") may be further disposed on the reflective layer.

In an embodiment, for example, the first pixel electrode 131, the second pixel electrode 231 and/or the third pixel electrode 331 may have a three-layer structure of ITO/Ag/ITO and the reflectivity of the multi-layer structure may be increased by forming an Ag layer having a cross-sectional thickness of more than about 1,000 angstroms (A). Accordingly, the reflectivity of the first pixel electrode 131, the second pixel electrode 231 and the third pixel electrode 331 may be higher than about 90%.

Each of the first intermediate layer 133, the second intermediate layer 233 and the third intermediate layer 333 may include an organic light emitting layer, and may further include at least one of a hole injection layer ("HIL"), a hole transport layer ("HTL"), an electron transport layer ("ETL") and an electron injection layer ("EIL"). However, the invention is not limited thereto, and each of the first intermediate layer 133, the second intermediate layer 233 and the third intermediate layer 333 may include an organic light emitting layer and may further may include other various functional layers.

An organic light emitting layer included in each of the first intermediate layer 133, the second intermediate layer 233 and the third intermediate layer 333 may emit blue light, green light and/or red light.

The blue light, green light and red light are just one example of colors of light, and the invention is not limited thereto. That is, if white light is emitted, a combination of various colors may be used besides a combination of red right, green light and blue light.

The opposite electrode 34 includes a reflective layer that may include at least one of Ag, Mg, Al, Li, Ca, Cu, LiF/Ca, LiF/Al, MgAg and CaAg. The reflectivity of the reflective layer may be higher than about 90%.

In the organic light emitting display apparatus 1, since each of the first pixel electrode 131, the second pixel electrode 231, the third pixel electrode 331 and the opposite electrode 34 include a reflective layer, light may not be emitted to the outside in the first light emitting area 100, the second light emitting area 200, and the third light emitting area 300. A optical waveguide (not shown) is disposed in the first, second and third light emitting areas 100, 200 and 300 and the light emitted from the first, second and third intermediate layers 133, 233 and 333 may be propagated to the outer area of the first, second and third light emitting areas 100, 200, and 300 and then may be emitted to the outside of the organic light emitting display apparatus 1.

The pixel definition layer 432 includes a substantially flat part 432c disposed in an area where the first pixel electrode 131 and the second pixel electrode 231 do not overlap. The pixel definition layer 432 also includes a first inclined part 432a extending from the flat part 432c to an end part of the first pixel electrode 131 and a second inclined part 432b extending from the flat part 432c to an end part of the second pixel electrode 231.

The first inclined part 432a and the second inclined part 432b may include a first inclination angle turning point Pa and a second inclination angle turning point Pb respectively, where a rate of change in an inclination angle is not continuous.

Figure 3:
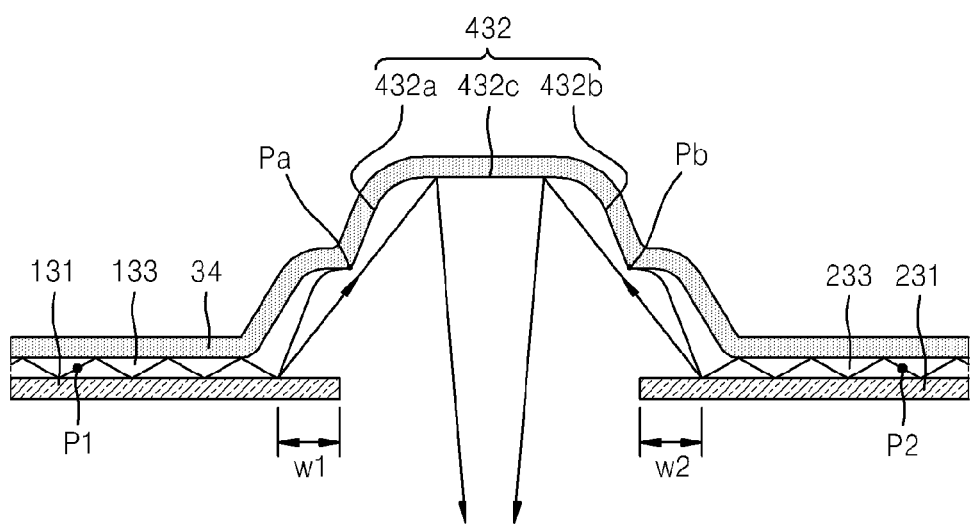
FIG. 3 is a conceptual diagram illustrating a light extraction principle in the organic light emitting display apparatus of FIG. 1.

FIG. 3 is a conceptual diagram illustrating light extraction in the organic light emitting display apparatus 1 of FIG. 1.

Referring to FIG. 3, light emitted from one area P1 of the first intermediate layer 133 may be propagated in a sideways or horizontal direction by an optical waveguide collectively formed by the first pixel electrode 131 and the opposite electrode 34 each including a reflective layer. In the same manner, light emitted from one area P2 of the second intermediate layer 233 may be propagated in a sideways or horizontal direction by an optical waveguide collectively formed by the second pixel electrode 231 and the opposite electrode 34 each including a reflective layer.

The light emitted and propagated from the first intermediate layer 133 and the second intermediate layer 233 may be incident onto the pixel definition layer 432 and then may be reflected by the opposite electrode 34 disposed on the pixel definition layer 432 and emitted to the outside of the organic light emitting display apparatus 1.

In order to allow propagated light to be emitted to the outside efficiently, the widths w1 and w2 of the areas at which the pixel definition layer 432 overlaps the first pixel electrode 131 and at which the pixel definition layer 432 overlaps the second pixel electrode 231 may be equal to or greater than about 3 micrometers (μm). Thus, by reflecting the light propagated within the optical waveguide, to the edge area of the first pixel electrode 131 and the second pixel electrode 231, and delivering the reflected light to the opposite electrode 34 overlapping the pixel definition layer 432, the efficiency of light emitted to the outside may be increased.

The pixel definition layer 432 includes a substantially flat part 432c disposed in an area where the first pixel electrode 131 and the second pixel electrode 231 do not overlap. The pixel definition layer 432 may also include a first inclined part 432a extending from the flat part 432c to an end part of the first pixel electrode 131 and a second inclined part 432b extending from the flat part 432c to an end part of the second pixel electrode 231.

The first inclined part 432a and the second inclined part 432b may include a first inclination angle turning point Pa and a second inclination angle turning point Pb respectively, where a rate of change in an inclination angle is different.

Since the pixel definition layer 432 is configured to include the first inclination angle turning point Pa and the second inclined turning point Pb, reflection of the propagated light by the opposite electrode 34 and not being emitted to the outside, and instead propagating to the side along the boundary between the pixel definition layer 432 and the opposite electrode 34 and disappearing may be reduced or effectively prevented.

One or more embodiment of the organic light emitting display apparatus 1 according to the invention may reduce or effectively prevent light loss due to total reflection between layers (which typically occurs in a general organic light emitting apparatus where light is emitted toward a pixel electrode and/or an opposite electrode). Therefore, light extraction efficiency may be improved.

Additionally, increase of an aperture ratio of an light emitting area in order to improve light extraction efficiency is obviated, since all light emitted from a sub-pixel area in each pixel, that is, the sub-pixel area first light emitting area 100, the second light emitting area 200 and the third light emitting area 300 of FIG. 1, is emitted to the outside through first light extraction region 400. Therefore, the area of each pixel may be minimized, thereby increasing the resolution of the organic light emitting display apparatus 1.

Figure 4:
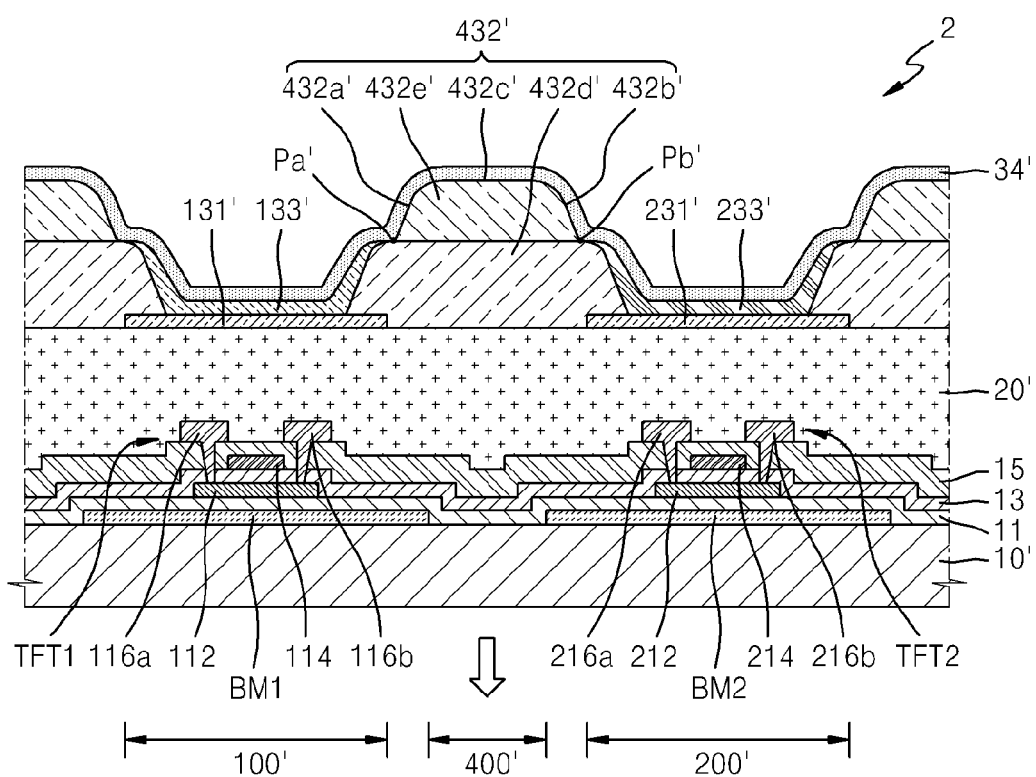
FIG. 4 is a cross-sectional view illustrating another embodiment of an organic light emitting display apparatus according to the invention.

FIG. 4 is a cross-sectional view illustrating another embodiment of an organic light emitting display apparatus 2 according to the invention.

Referring to FIG. 4, the organic light emitting display apparatus 2 includes a first pixel electrode 131', a second pixel electrode 231', a pixel definition layer 432', a first intermediate layer 133', a second intermediate layer 233' and an opposite electrode 34'. The pixel electrode 131' and the second pixel electrode 231', each including a reflective layer, are disposed spaced apart from each other on a substrate 10' including a first light emitting area 100', a second light emitting area 200' and a first light extraction region 400'. The pixel definition layer 432' extends from an end part of the first pixel electrode 131' to an end part of the second pixel electrode 231' adjacent to the end part of the first pixel electrode 131' and covers the end part of the first pixel electrode 131' and the end part of the second pixel electrode 231'. The first intermediate layer 133' and the second intermediate layer 233' are respectively disposed on the first pixel electrode 131' and the second pixel electrode 231'. The opposite electrode 34' is disposed on the first intermediate layer 133', the second intermediate layer 233' and the pixel definition layer 432' and includes a reflective layer.

A first black matrix BM1 may be disposed between the substrate 10' and the first pixel electrode 131' and a second black matrix BM2 may be disposed between the substrate 10' and the second pixel electrode 231'.

The first black matrix BM1 and the second black matrix BM2 correspond to the first light emitting area 100' and the second light emitting area 200', respectively, and a black matrix may not be disposed in an area corresponding to the first light extraction region 400'.

The widths of the first black matrix BM1 and the second black matrix BM2 may be equal to or greater than the widths of the first pixel electrode 131' and the second pixel electrode 231', respectively, in the top plan view.

By disposing the first and second black matrixes BM1 and BM2 in an area other than the first light extraction region 400' via which light is emitted, reflection of external light by a metal in the organic light emitting display apparatus 2 may be minimized, thereby reducing or effectively preventing deterioration of visibility. Through the above configuration, disposing a polarizer for preventing external light reflection is obviated, and accordingly, absorption of light by a polarizer may be omitted, thereby reducing or effectively preventing deterioration of light extraction efficiency.

A first thin film transistor TFT1 and a second thin film transistor TFT2 electrically connected to the first pixel electrode 131' and the second pixel electrode 231', respectively, may be disposed on the substrate 10' and in areas corresponding to the first light emitting area 100' and the second light emitting area 200'.

The first thin film transistor TFT1 and the second thin film transistor TFT2 may be disposed in an area where the first pixel electrode 131' and the second pixel electrode 231' overlap, respectively.

Since the organic light emitting display apparatus 2 separately includes an area emitting light and an area allowing light to be emitted to the outside (e.g., the light extraction area), by disposing semiconductor devices such as a thin film transistor in an area emitting light, that is, an area corresponding to the first pixel electrode 131' and the second pixel electrode 231', an additional space for a semiconductor device is not required.

That is, through the above configuration, a resolution of the organic light emitting display apparatus 2 may be increased.

The first black matrix BM1 and the second black matrix BM2 are disposed on the substrate 10' such as a glass substrate or a transparent plastic substrate, and a first insulating layer 11 may be disposed to cover the first black matrix BM1 and the second black matrix BM2.

A first thin film transistor TFT1 including a first active layer 112, a first gate electrode 114, a first source electrode 116a and a first drain electrode 116b and a second thin film transistor TFT2 including a second active layer 212, a second gate electrode 214, a second source electrode 216a and a second drain electrode 216b, may be disposed on the first insulating layer 11.

A second insulating layer 13 may be disposed between the active layers 112 and 212 and the gate electrodes 114 and 214, respectively. A third insulating layer 15 may be disposed between the gate electrodes 114 and 214, and the source electrodes 116a and 216a and the drain electrodes 116b and 216b, respectively.

A fourth insulating layer 20' covering the source electrodes 116a and 216a and the drain electrodes 116b and 216b may be disposed on the third insulating layer 15. The fourth insulating layer 20' may have a planarization function and may include an organic material.

The first pixel electrode 131' and the second pixel electrode 231' may be disposed respectively in the first light emitting area 100' and the second light emitting area 200' on the fourth insulating layer 20', and the pixel definition layer 432' may be disposed in an area corresponding to the first light extraction region 400'.

The pixel definition layer 432 covering end parts of the first pixel electrode 131' and the second pixel electrode 231' may include a substantially flat part 432c' disposed in an area where the first pixel electrode 131' and the second pixel electrode 231' do not overlap. The pixel definition layer 432 also includes a first inclined part 432a' extending from the flat part 432c' to the end part of the first pixel electrode 131' and a second inclined part 432b' extending from the flat part 432c to the end part of the second pixel electrode 231'.

The first inclined part 432a' and the second inclined part 432b' may further include a first inclination angle turning point Pa' and a second inclination angle turning point Pb' respectively, where a rate of change in an inclination angle is not continuous.

The pixel definition layer 432' further includes a first area (layer) 432d' and a second area (layer) 432e', which are respectively disposed below and above a line connecting the first inclination angle turning point Pa' and the second inclination angle turning point Pb'.

The first area 432d' and the second area 432e' may be configured with different layers and may each include an organic material. The organic materials included in the first area 432d' and the second area 432e' may be the same or different materials.

In an embodiment, for example, the first area 432d' and the second area 432e' may include polyimide ("PI"), but the invention is not limited thereto.

Although not shown in the drawing, an encapsulation member (not shown) may be disposed on the opposite electrode 34'. The encapsulation member may be a substrate including a glass or plastic, a metal film, or a thin film which include an organic insulating layer and an inorganic insulating layer, which are disposed alternately.

The second area 432e' of the pixel definition layer 432' may serve as spacer for adjusting an interval between the substrate 10' and the encapsulation member.

Figure 5:
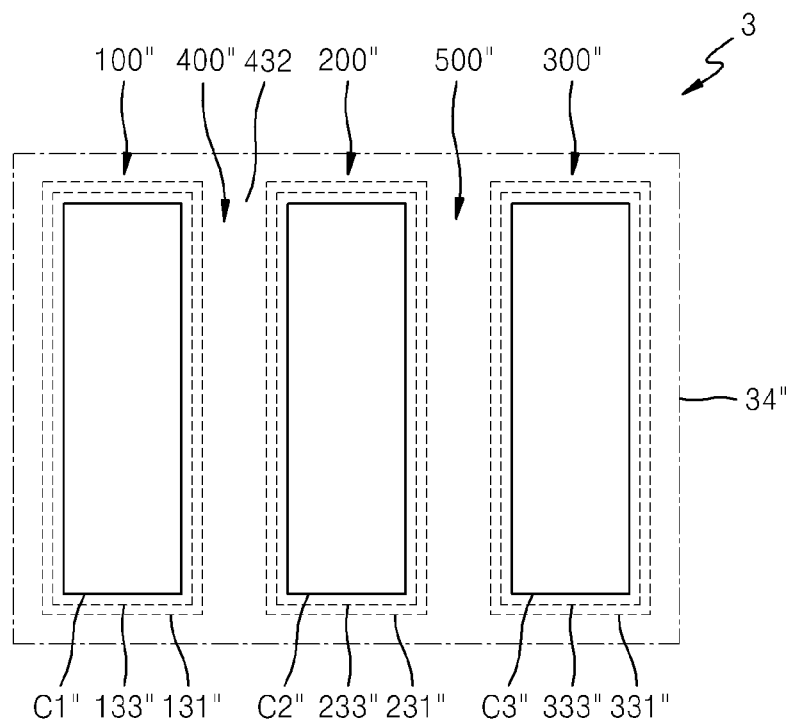
FIG. 5 is a top plan view illustrating still another embodiment of an organic light emitting display apparatus according to the invention.

FIG. 5 is a plan view illustrating still another embodiment of an organic light emitting display apparatus 3 according to the invention.

Referring to FIG. 5, the organic light emitting display apparatus 3 includes a first light emitting area 100", a second light emitting area 200" and a third light emitting area 300" defined therein. A first light extraction region 400" may be disposed between the first light emitting area 100" and the second light emitting area 200", and a second light extraction region 500" may be disposed between the second light emitting area 200" and the third light emitting area 300".

A first pixel electrode 131", which includes a reflective layer, and a first intermediate layer 133", which is disposed on the first pixel electrode 131", are disposed in the first light emitting area 100". A second pixel electrode 231", which includes a reflective layer, and a second intermediate layer 233", which is disposed on the second pixel electrode 231", are disposed in the second light emitting area 200". A third pixel electrode 331", which includes a reflective layer, and a third intermediate layer 333", which is disposed on the third pixel electrode 331", may be disposed in the third light emitting area 300".

A pixel definition layer 432" may be disposed between the first pixel electrode 131" and the second pixel electrode 231", which are spaced apart from each other in the top plan view. An opening C1 "exposing a portion of the first pixel electrode 131" and an opening C2" exposing a portion of the second pixel electrode 231" may be defined in the pixel definition layer 432".

The pixel definition layer 432" may be disposed between the second pixel electrode 231" and the third pixel electrode 331", An opening C3" exposing a portion of the third pixel electrode 331" may be defined in the pixel definition layer 432".

An opposite electrode 34", which includes a reflective layer, may be disposed on the first intermediate layer 133", the second intermediate layer 233", the third intermediate layer 333', and the pixel definition layer 432". That is, the opposite electrode 34" may be commonly disposed on an entire pixel of the organic light emitting display apparatus 1 among a plurality of pixels thereof.

The first light extraction region 400", light from the first intermediate layer 133" and the second intermediate layer 233" may be emitted to the outside. In the second light extraction region 500", light from the second intermediate layer 233" and the third intermediate layer 333" may be emitted to the outside.

In an embodiment, for example, the first intermediate layer 133", the second intermediate layer 233" and the third intermediate layer 333" may emit blue light, green light and red light, respectively, and the first light extraction region 400" may emit blue light and green light to the outside. The second light extraction region 500" may emit green light and red light to the outside.

The organic light emitting display apparatuses 1 and 3 respectively shown in FIGS. 1 and 5 show exemplary pixel arrangement structures, but the invention is not limited thereto. Thus, each light emitting area in a pixel may be arranged in various forms.

The organic light emitting display apparatuses, 1, 2 and 3 may have improved light extraction efficiency since a light emitting area is separated from a light extracting area and at least two colors are emitted from the light extracting area. Therefore, the area of each pixel is minimized, thereby increasing a resolution of the organic light emitting display apparatuses 1, 2 and 3.

It should be understood that the embodiments described therein should be considered in a descriptive sense only and not for purposes of limitation. Descriptions of features within each embodiment should typically be considered as available for other similar features in other embodiments.

While one or more embodiments of the invention have been described with reference to the figures, it will be understood by those of ordinary skill in the art that various changes in form and details may be made therein without departing from the spirit and scope of the invention as defined by the following claims.

What is claimed is:

1. An organic light emitting display apparatus comprising:
   a reflective first pixel electrode and a reflective second pixel electrode through which light is not emitted, the reflective first and second pixel electrodes disposed on a substrate, spaced apart from each other and each comprising a reflective layer therein;
   a pixel definition layer extending between and overlapping adjacent edges of the reflective first pixel electrode and the reflective second pixel electrode;
   a reflective opposite electrode on the reflective first pixel electrode, on the reflective second pixel electrode and on the pixel definition layer; and
   a first intermediate layer and a second intermediate layer respectively between the reflective opposite electrode and the reflective first pixel electrode and between the reflective opposite electrode and the reflective second pixel electrode.

2. The apparatus of claim 1, wherein the pixel definition layer extending between and overlapping adjacent edges of the reflective first pixel electrode and the reflective second pixel electrode comprises:
   a flat part in an area between the reflective first pixel electrode and the reflective second pixel electrode in a plan view;
   a first inclined part extending from the flat part to the edge of the reflective first pixel electrode; and
   a second inclined part extending from the flat part to the edge of the reflective second pixel electrode.

3. The apparatus of claim 2, wherein the first inclined part and the second inclined part have a first inclination angle turning point and a second inclination angle turning point, respectively, where a rate of change in an inclination angle thereof is not continuous.

4. The apparatus of claim 3, wherein the pixel definition layer further comprises a first layer area and a second layer area respectively on a bottom and a top with respect to a virtual line connecting the first inclination angle turning point and the second inclination angle turning point to each other.

5. The apparatus of claim 1, further comprising a first black matrix and a second black matrix respectively between the substrate and the reflective first pixel electrode, and between the substrate and the reflective second pixel electrode.

6. The apparatus of claim 5, wherein widths of the first black matrix and the second black matrix are equal to or greater than widths of the reflective first pixel electrode and the reflective second pixel electrode, respectively, in a plan view.

7. The apparatus of claim 1, wherein a width of an area of the reflective first pixel electrode and the reflective second pixel electrode, respectively, overlapped by the pixel definition layer at the edge of the reflective first pixel electrode and the reflective second pixel electrode, is equal to or greater than about 3 micrometers.

8. The apparatus of claim 1, further comprising a first thin film transistor and a second thin film transistor on the substrate and electrically connected to the reflective first pixel electrode and the reflective second pixel electrode, respectively,
   wherein the first thin film transistor and the second thin film transistor respectively overlap the reflective first pixel electrode and the reflective second pixel electrode overlap, in a plan view.

9. The apparatus of claim 1, wherein a reflectivity of each of the reflective first pixel electrode, the reflective second pixel electrode and the reflective opposite electrode is equal to or greater than about 90%.

10. The apparatus of claim 1, wherein
    the first intermediate layer emits one of red light, green light and blue light, and
    the second intermediate layer emits light of a different color from that emitted by the first intermediate layer.

11. An organic light emitting display apparatus comprising:
    a first light emitting area at which light is not emitted to outside the organic light emitting display apparatus, comprising:
       a reflective first pixel electrode through which light is not transmitted, the reflective first pixel electrode comprising a reflective layer therein, and
       a first intermediate layer on the reflective first pixel electrode and configured to emit light;
    a second light emitting area at which light is not emitted to outside the organic light emitting display apparatus, comprising:
       a reflective second pixel electrode through which light is not transmitted, the reflective second pixel electrode spaced apart from the reflective first pixel electrode and comprising a reflective layer therein, and
       a second intermediate layer on the reflective second pixel electrode and configured to emit light; and
    a first light extraction region between the first light emitting area and the second light emitting area and at which light is emitted to outside the organic light emitting display apparatus,
    wherein emitted first light from the first intermediate layer and the second intermediate layer propagates to the first light extraction region between the first light emitting area and the second light emitting area and the propagated emitted first light is emitted to outside the organic light emitting display apparatus through the first light extraction region.

12. The apparatus of claim 11, further comprising:
    a pixel definition layer in the first light extraction region, the pixel definition layer extending between the reflective first pixel electrode and the reflective second pixel electrode to overlap adjacent edges of the reflective first pixel electrode and the reflective second pixel electrode; and
    a reflective opposite electrode on the first intermediate layer, on the second intermediate layer and on the pixel definition layer.

13. The apparatus of claim 12, further comprising a third light emitting area at which light is not emitted to outside the organic light emitting display apparatus, comprising:
    a reflective third pixel electrode spaced apart from the reflective first pixel electrode and the reflective second pixel electrode, and comprising a reflective layer therein, and
    a third intermediate layer on the reflective third pixel electrode and configured to emit light,
    wherein
    a total area of the first light emitting area is greater than a sum of areas of the second light emitting area and the third light emitting area,
    the first light extraction region at which light is emitted to outside the organic light emitting display apparatus is between the first light emitting area and the third light emitting area, and
    emitted second light from the first intermediate layer and the third intermediate layer propagates to the first light extraction region between the first light emitting area and the third light emitting area and the propagated emitted second light is emitted to outside the organic light emitting display apparatus through the first light extraction region.

14. The apparatus of claim 13, wherein the first intermediate layer, the second intermediate layer and the third intermediate layer emit blue light, green light and red light, respectively, and the first light extraction region at which light is emitted to outside the organic light emitting display apparatus emits the blue light, the green light and the red light propagated thereto from the first through third intermediate layers, to outside the organic light emitting display apparatus.

15. The apparatus of claim 12, further comprising:

a third light emitting area at which light is not emitted to outside the organic light emitting display apparatus, comprising:

a reflective third pixel electrode spaced apart from the reflective second pixel electrode and comprising a reflective layer therein, and a third intermediate layer disposed on the reflective third pixel electrode and configured to emit light; and a second light extraction region between the second light emitting area and the third light emitting area and at which light is emitted to outside the organic light emitting display apparatus, wherein emitted third light from the second intermediate layer and the third intermediate layer propagates to the second light extraction region between the second light emitting area and the third light emitting area and the propagated emitted third light is emitted to outside the organic light emitting display apparatus through the second light extraction region.

* * * * *